United States Patent
Pham et al.

(10) Patent No.: US 9,263,585 B2
(45) Date of Patent: Feb. 16, 2016

(54) METHODS OF FORMING ENHANCED MOBILITY CHANNEL REGIONS ON 3D SEMICONDUCTOR DEVICES, AND DEVICES COMPRISING SAME

(71) Applicant: GLOBALFOUNDRIES Inc., Grand Cayman, KY (US)

(72) Inventors: Daniel T. Pham, Clifton Park, NY (US); Robert J. Miller, Yorktown Heights, NY (US); Kungsuk Maitra, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 365 days.

(21) Appl. No.: 13/663,854

(22) Filed: Oct. 30, 2012

(65) Prior Publication Data

US 2014/0120677 A1    May 1, 2014

(51) Int. Cl.
| | |
|---|---|
| *H01L 21/336* | (2006.01) |
| *H01L 29/78* | (2006.01) |
| *H01L 29/66* | (2006.01) |
| *H01L 21/265* | (2006.01) |

(52) U.S. Cl.
CPC ...... *H01L 29/7851* (2013.01); *H01L 21/26506* (2013.01); *H01L 29/66795* (2013.01); *H01L 29/7842* (2013.01)

(58) Field of Classification Search
CPC .............. H01L 29/7843; H01L 29/66795; H01L 29/7842; H01L 21/225; H01L 21/265; H01L 21/336; H01L 21/823431; H01L 29/7851
USPC ............ 438/283, 524; 257/E21.421, E21.334
See application file for complete search history.

(56) References Cited

U.S. PATENT DOCUMENTS

| | | | |
|---|---|---|---|
| 6,413,802 B1 | 7/2002 | Hu et al. | |
| 6,642,090 B1* | 11/2003 | Fried et al. | 438/164 |
| 6,838,322 B2 | 1/2005 | Pham et al. | |
| 6,989,308 B2 | 1/2006 | Furukawa et al. | |
| 7,452,758 B2 | 11/2008 | Dyer et al. | |
| 7,679,134 B1 | 3/2010 | Buynoski et al. | |
| 7,842,566 B2 | 11/2010 | Lee et al. | |
| 7,863,122 B2 | 1/2011 | Booth, Jr. et al. | |
| 7,872,303 B2 | 1/2011 | Chan et al. | |
| 7,906,814 B2 | 3/2011 | Lee | |
| 2006/0088967 A1 | 4/2006 | Hsiao et al. | |
| 2006/0175669 A1 | 8/2006 | Kim et al. | |
| 2006/0284255 A1 | 12/2006 | Shin et al. | |
| 2008/0296632 A1 | 12/2008 | Moroz et al. | |
| 2009/0108353 A1 | 4/2009 | Cho | |
| 2009/0224357 A1* | 9/2009 | Juengling | 257/506 |
| 2010/0078727 A1* | 4/2010 | Min et al. | 257/369 |
| 2011/0097889 A1 | 4/2011 | Yuan et al. | |
| 2011/0207309 A1* | 8/2011 | Izumida et al. | 438/514 |
| 2013/0157431 A1* | 6/2013 | Tsai | H01L 29/66545 438/299 |
| 2013/0200470 A1* | 8/2013 | Liu et al. | 257/408 |
| 2013/0277686 A1* | 10/2013 | Liu et al. | 257/77 |
| 2014/0027816 A1* | 1/2014 | Cea | H01L 29/66545 257/192 |
| 2014/0054648 A1* | 2/2014 | Itokawa et al. | 257/192 |
| 2014/0061794 A1* | 3/2014 | Cheng et al. | 257/347 |

* cited by examiner

*Primary Examiner* — Matthew Landau
*Assistant Examiner* — Eric Ashbahian
(74) *Attorney, Agent, or Firm* — Amerson Law Firm, PLLC

(57) ABSTRACT

Disclosed herein are various methods of forming stressed channel regions on 3D semiconductor devices, such as, for example, FinFET semiconductor devices, through use of epitaxially formed materials. In one example, the method includes forming a plurality of spaced-apart trenches in a semiconducting substrate, wherein the trenches define at least a portion of a fin for the device, and performing an epitaxial deposition process to form an epitaxially formed stress-inducing material in the trenches.

21 Claims, 5 Drawing Sheets

US 9,263,585 B2

METHODS OF FORMING ENHANCED MOBILITY CHANNEL REGIONS ON 3D SEMICONDUCTOR DEVICES, AND DEVICES COMPRISING SAME

BACKGROUND OF THE INVENTION

1. Field of the Invention

Generally, the present disclosure relates to the manufacture of sophisticated semiconductor devices, and, more specifically, to various methods of forming stressed channel regions on 3D semiconductor devices, such as, for example, FinFET semiconductor devices, through use of epitaxially formed materials to thereby form channel regions having enhanced mobility characteristics.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device designers have recently employed channel stress engineering techniques on FETs to improve the electrical performance of such devices, i.e., to improve the mobility of the charge carriers. More specifically, such stress engineering techniques generally involve creating a tensile stress in the channel region for an NMOS transistor and creating a compressive stress in the channel region for a PMOS transistor. Stress engineering techniques typically involve the formation of specifically made silicon nitride layers that are selectively formed above appropriate transistors, i.e., a layer of silicon nitride that is intended to impart a tensile stress in the channel region of an NMOS transistor would only be formed above the NMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art. Other techniques employed to induce the desired stress on a FET involves forming recesses or cavities in the substrate where source/drain regions will be formed and thereafter forming a stress-inducing material, such as an epitaxially formed silicon/germanium material, in the cavities to induce the desired stress in the channel region of the transistor.

In general, stress engineering techniques for FinFETs have generally involved forming stress-inducing layers of material over or within the source and drain regions of the FinFET. As noted above, a FinFET is a 3-dimensional device where stress engineering techniques may be very complex to implement. Therefore, there is a need for various methods and structures to improve carrier mobility in FinFETs.

The present disclosure is directed to various methods of forming stressed channel regions on 3D semiconductor devices, such as, for example, FinFET semiconductor devices, through use of epitaxially formed materials to thereby enhance the performance characteristics of such 3D devices by forming channel regions having enhanced mobility characteristics.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming stressed channel regions on 3D semiconductor devices, such as, for example, FinFET semiconductor devices, through use of epitaxially formed materials to thereby form channel regions having enhanced mobility characteristics. In one example, the method includes forming a plurality of spaced-apart trenches in a semiconducting substrate, wherein the trenches define at least a portion of a fin for the device, and performing an epitaxial deposition process to form an epitaxially formed stress-inducing material in the trenches.

In another illustrative example, a method is disclosed that includes performing a first etching process to form a plurality of spaced-apart initial trenches in a semiconducting substrate, wherein the initial trenches define at least a portion of a fin for the device, forming sidewall spacers on the fin, after forming the sidewall spacers, performing a second etching process to extend a depth of the initial trenches so as to thereby define a plurality of spaced-apart final trenches, performing an ion implant process to form implant regions in the substrate below a bottom surface of the final trenches and, after performing the ion implant process, performing an epitaxial deposition process to form an epitaxially formed stress-inducing material in the final trenches.

In yet another illustrative example, a method is disclosed that includes forming a plurality of spaced-apart trenches in a semiconducting substrate, wherein the trenches define at least a portion of a fin for the device, performing an ion implant process to form implant regions in the substrate below a bottom surface of the trenches, and performing an anneal process on the device after the implant regions are formed so as to create defect regions in the substrate proximate a position of the implant regions.

BRIEF DESCRIPTION OF THE DRAWINGS

The disclosure may be understood by reference to the following description taken in conjunction with the accompanying drawings, in which like reference numerals identify like elements, and in which.

Figure 1A:
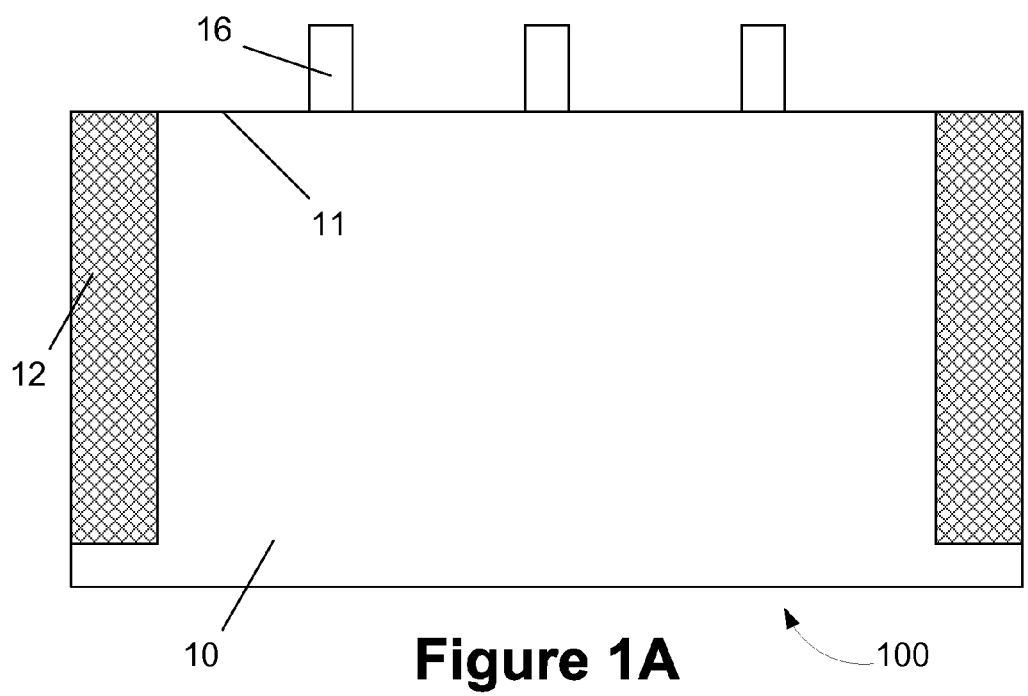
FIGS. 1A-1J depict various illustrative methods disclosed herein of forming 3D semiconductor devices with desired stress profiles using a stress-inducing material to thereby form channel regions having enhanced mobility characteristics.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming stressed channel regions on 3D semiconductor devices, such as, for example, FinFET semiconductor devices, through use of epitaxially formed materials to thereby form channel regions having enhanced mobility characteristics. As will be readily apparent to those skilled in the art upon a complete reading of the present application, the present method is applicable to a variety of devices, including, but not limited to, logic devices, memory devices, etc. With reference to FIGS. 1A-1J, various illustrative embodiments of the methods and devices disclosed herein will now be described in more detail.

FIG. 1A is a simplified view of an illustrative FinFET semiconductor device 100 at an early stage of manufacturing. The FinFET device 100 is formed in and above a bulk semiconducting substrate 10 having an upper surface 11. The substrate 10 may be comprised of a variety of semiconducting materials such as, for example, silicon or silicon/germanium, etc. An illustrative trench isolation structure 12 has been formed in the substrate 10 to define an active region where the device 100 will be formed. In general, the depth of the trench isolation structure 12 may be chosen to lessen current flow between adjacent active regions. In a typical case, the isolation region 12 may have a depth of about 50-250 nm, but it can have a greater depth if the application requires a greater degree of isolation. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could by comprised of a variety of materials, such as, for example, silicon nitride, silicon oxynitride, hafnium oxide, etc., or it could be a soft mask layer for which certain organic polymeric materials that are resistant to the etching chemicals and processes are commonly used. For construction of Fin-FETs in substrates other than silicon or silicon/germanium, other hard mask materials are known and may be considered by those skilled in the art to be more appropriate, depending upon the particular application. Moreover, the patterned mask layer 16 could be comprised of multiple layers of material such as, for example, a pad oxide layer (not shown) that is formed on the substrate 10 and a silicon nitride layer (not shown) that is formed on the pad oxide layer. Thus, the particular form and composition of the patterned mask layer 16, and the manner in which it is made, should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application and the capability of the material to withstand the attack of the chemical species used to etch the substrate material. In one illustrative embodiment, the patterned mask layer 16 is a layer of silicon nitride having a thickness of about 20-50 nm that is initially formed by performing a CVD process.

Figure 1B:
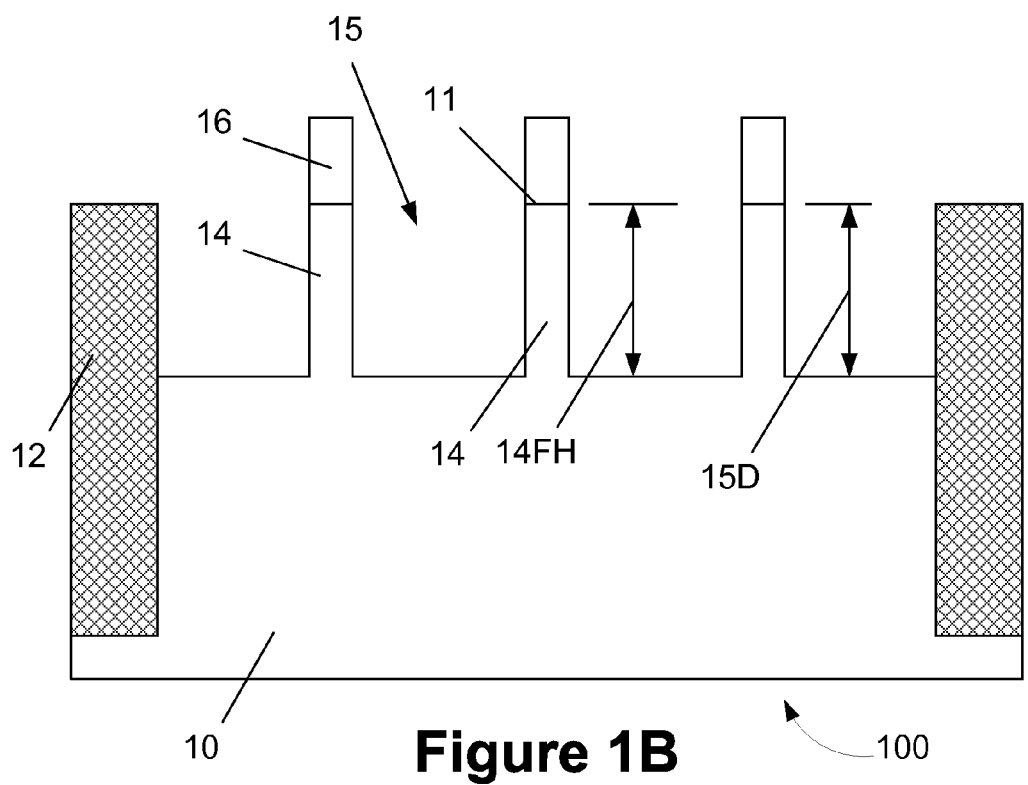

Next, as shown in FIG. 1B, an etching process, such as a dry or wet etching process, is performed on the substrate 10 through the patterned mask layer 16 to form a plurality of initial trenches 15. This etching process results in the definition of a plurality of fins 14. The overall size, shape and configuration of the fins 14 may vary depending upon the particular application. In one illustrative embodiment, the initial trenches 15 are initially formed such that the depth 15D of the initial trenches 15 corresponds approximately to the desired final height 14FH of the fins 14. In one illustrative embodiment, the final desired height 14FH of the fins 14 may be approximately 10-40 nm, and the lateral width of the fins 14 may be on the order of about 7-18 nm.

Figure 1C:
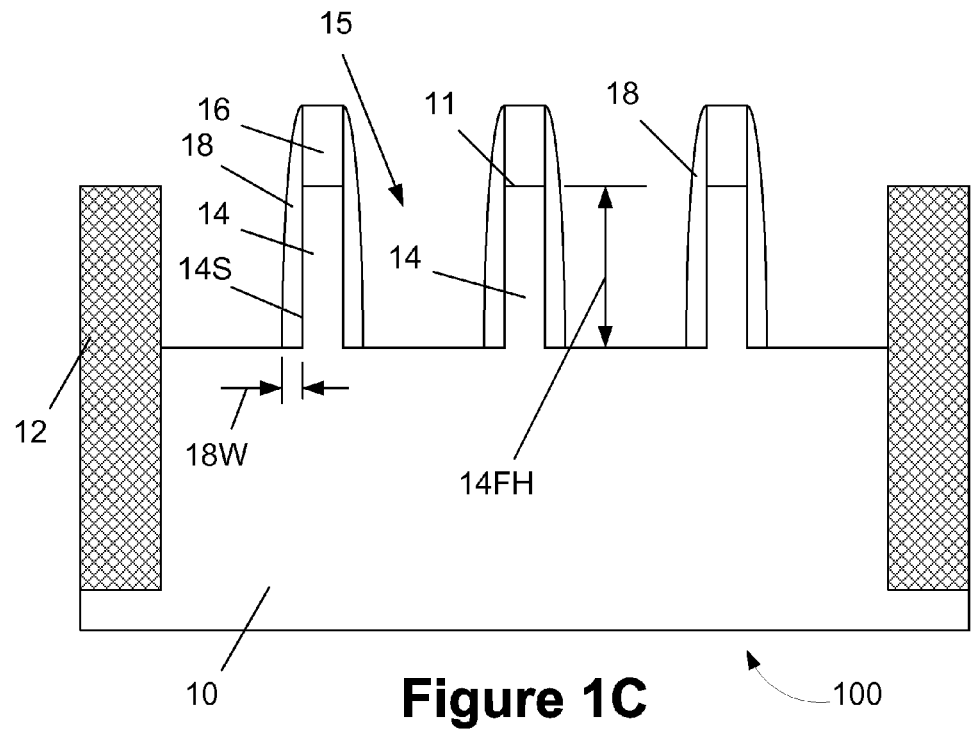

Then, as shown in FIG. 1C, sidewall spacers 18 are formed proximate the fins 14. The spacers 18 may be formed from a variety of materials such as, for example, silicon nitride, silicon oxynitride, etc. Other materials may be appropriately chosen if the FinFETs were being created in other semiconducting substrate materials. The spacers 18 may be made by conformably depositing a layer of spacer material and thereafter performing an anisotropic etching process. In one illustrative embodiment, the spacers 18 may have a base width 18W of about 3-9 nm.

Figure 1D:
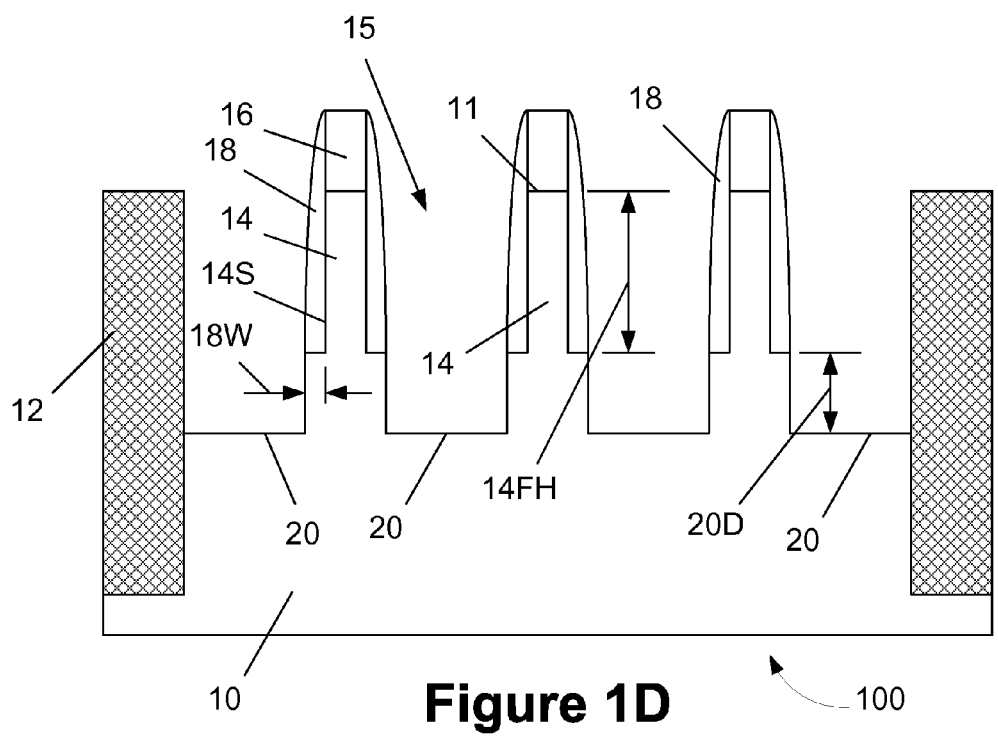

With reference to FIG. 1D, in one illustrative example, the next process operation involves the formation of a plurality of final trenches 20 in the substrate 10 proximate the fins 14. The final trenches 20 effectively increase the depth of the initial trenches 15. The overall size, shape and configuration of the final trenches 20 may vary depending on the particular application, and the manner in which they are formed may also vary. In general, in one example, the final trenches 20 may have a vertical depth 20D that ranges from about 50-300 nm relative to the base of the fins 14 and a lateral width that ranges from about 15-50 nm. Additionally, in the depicted example, the sidewalls of the final trenches 20 may be laterally offset from the sides 14S of the fins 14 by a distance that corresponds approximately to the width 18W of the spacers 18. In the example depicted in FIG. 1D, the final trenches 20 are formed by performing an anisotropic etching process that results in the final trenches 20 having a schematically depicted, generally rectangular configuration.

Figure 1E:
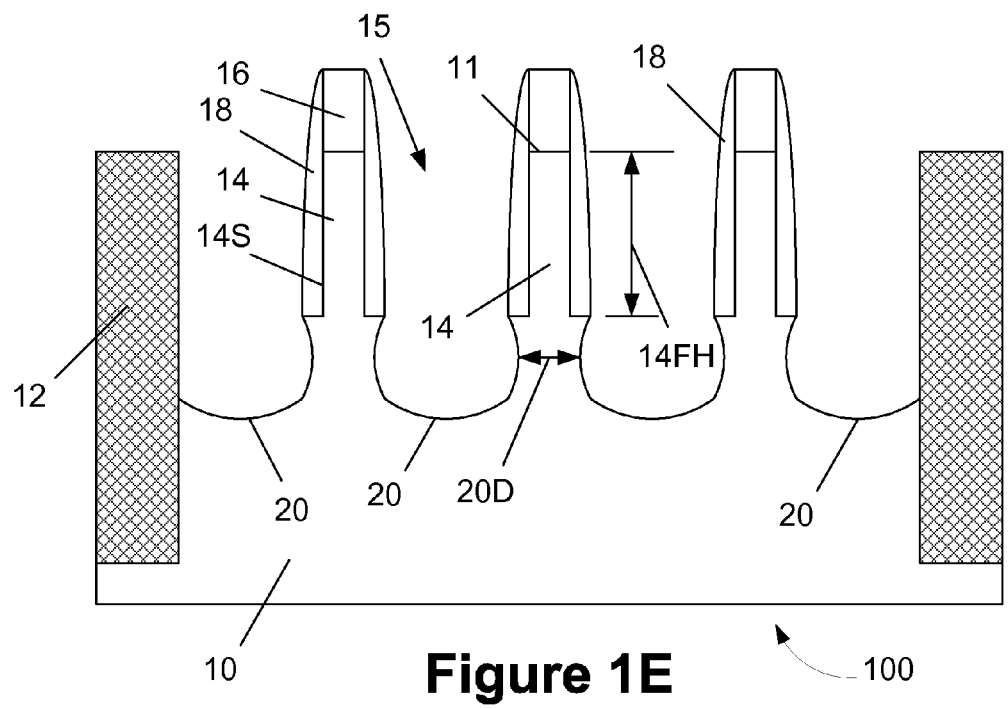

FIG. 1E depicts an illustrative example where the final trenches 20 are formed by performing a wet etching process. The final trenches 20 resulting from the wet etching process may tend to have a more rounded or optimally angled configuration and the resulting final trenches 20 may tend to effectively reduce the lateral distance 20D between adjacent final trenches 20 as compared to the lateral dimension between adjacent final trenches 20 that are formed by performing an anisotropic etching process. As will be recognized by those skilled in the art after a complete reading of the present application, the final trenches 20 may be formed using a variety of techniques. Thus, the size and configuration of the final trenches 20, and the manner in which they are made, should not be considered a limitation of the present invention. For ease of disclosure, only the substantially rectangular final trenches 20 will be depicted in subsequent drawings.

Figure 1F:
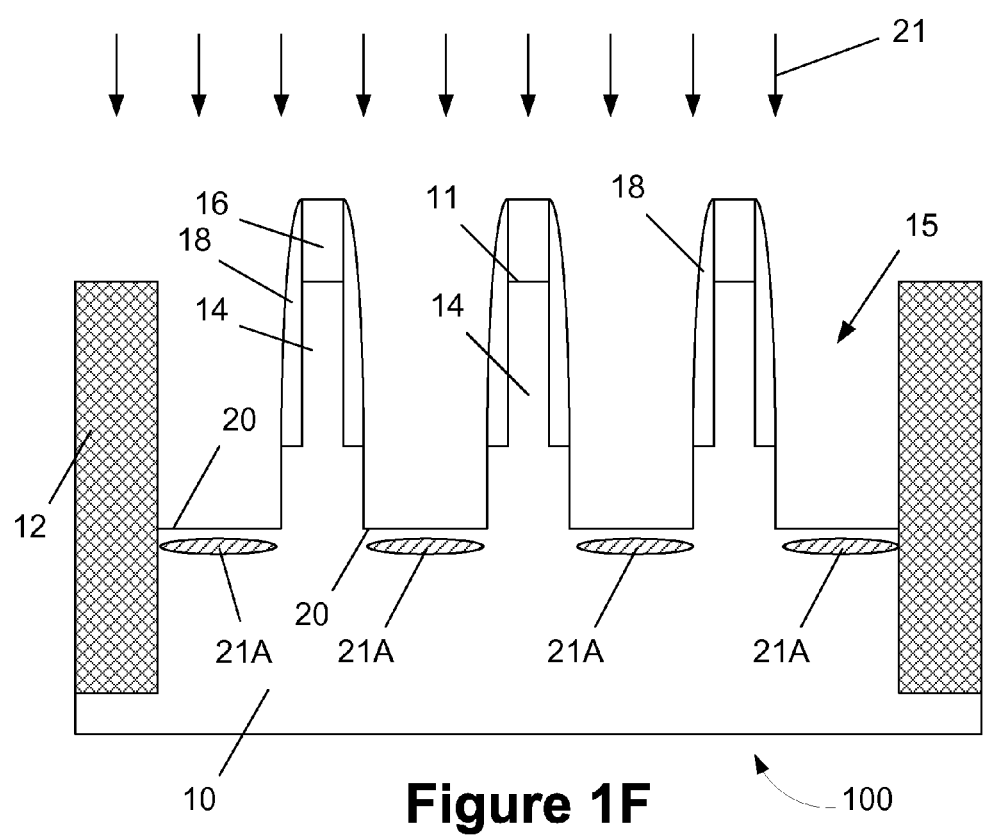

Next, in one illustrative embodiment, as shown in FIG. 1F, the methods disclosed herein involve performing a process operation 21 to introduce atoms into the substrate 10 and thereby form what will generally be referred to as implant regions 21A in the substrate 10 proximate the bottom of the final trenches 20. In one illustrative embodiment, the process operation 21 may be an ion implantation process while, in other applications, it may be another type of process, e.g., a germanium condensation process, a thermal mixing process, etc. Irrespective of the type of process operation 21 employed, the resulting region of the substrate 10 that contains the species introduced by performing the process operation 21 will be referred to herein and in the claims as "implant regions." In some cases, the process operation 21 may be performed to introduce a species that is generally larger than the atoms of the substrate 10, although that is not the case in all situations, e.g., hydrogen may be introduced into silicon in some applications. In one illustrative example, the process operation 21 is an ion implantation process that may be performed using germanium, tin, xenon, krypton, hydrogen, etc. In such an application, the implant process may be a substantially vertically oriented implant process (as depicted) or it may involve some degree of tilting, depending upon the particular application and the desired location of the implant regions 21A. In general, as noted above, the atoms selected for the process operation 21 may be larger in size than the atoms of the substrate 10, e.g., silicon in the depicted example. The implant dose and implant energy may vary depending on the particular application. In one illustrative embodiment, the ion implant process may be performed with an implant dose of $1e^{15}$-$2e^{17}$ ions/cm$^2$ and at an energy level of about 7-30 keV. In this illustrative example, the depth of the peak concentration of the implant regions 21A may have a target depth of about 5-25 nm below the bottom of the final trenches 20. The purpose of forming the implant regions 21A is so that they will create a defect plane in the substrate 10 when the device is subjected to an anneal process or when a subsequent material, such as an epitaxially formed material, is formed in the trenches 20 (as described further below). In one example, a flash or laser anneal process at a temperature of about 900-1100° C. may be performed on the device after the implant regions 21A are formed in the substrate 10 to form defect planes or regions 21B (see FIG. 1J). In some applications, much lower anneal temperatures (down to about 650° C.) can also induce defective re-crystallization after implantation of some species, at selected dose and energy. The formation of these defect regions is beneficial because it will effectively enable more stress to be applied to the fins 14. Of course, as will be recognized by those skilled in the art after a complete reading of the present application, the implant regions 21A need not be formed in all embodiments of the various inventions disclosed herein. So as not to obscure the present inventions, the implant regions 21A will not be depicted in all of the subsequent drawings with the understanding that such regions 21A may be present in the device 100 in each of the following drawings if desired. Additionally, in some aspects disclosed herein, depending upon the type of process operation 21 employed, the process operation 21 may be performed after the formation of the initial trenches 15 and before the formation of the deeper final trenches 20. In some additional cases, where the process operation 21 is an ion implantation process, dopant atoms may be co-implanted with the atoms implanted for defect generation and these dopant atoms themselves may also influence the defect generation process.

Figure 1G:
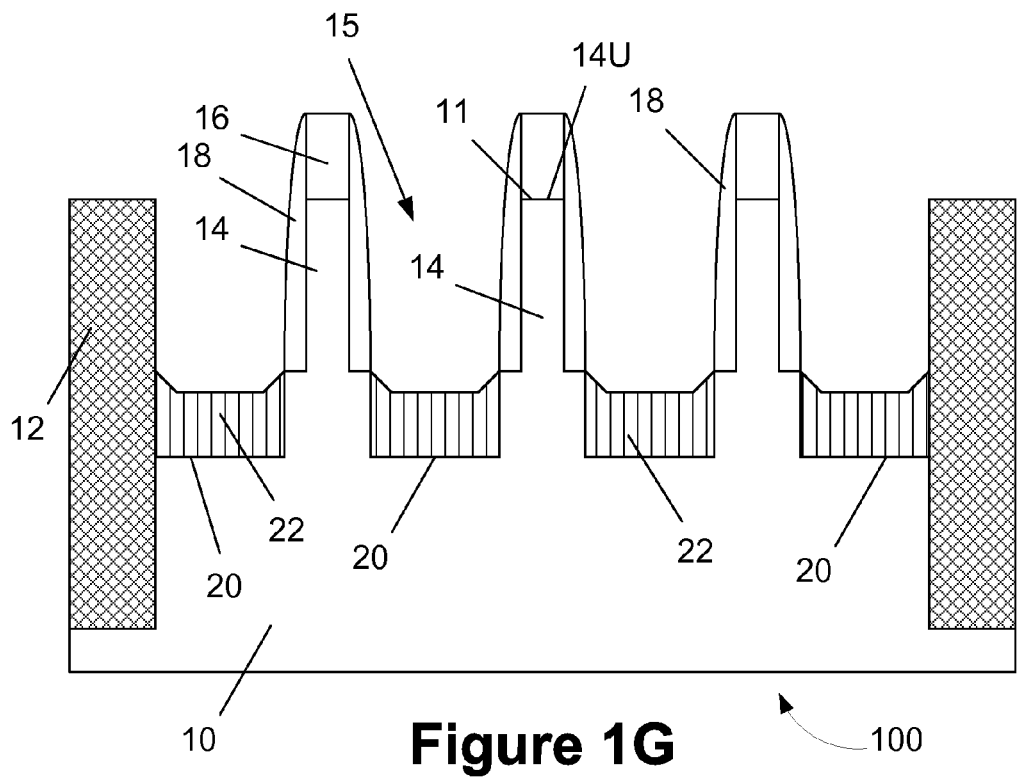

With reference to FIG. 1G, in one illustrative embodiment, the next process operation involves the formation of stress-inducing epitaxially formed material 22 in the trenches 20. The stress-inducing epitaxially formed material 22 has an upper surface that is below an upper surface 14U of the fins 14. The stress-inducing material 22 may be comprised of a variety of materials, such as a semiconducting material, e.g., silicon/germanium epi, carbon-doped silicon epi, etc., or it may be a rare-earth oxide material. The stress-inducing material 22 may be formed by performing a variety of known epitaxial deposition processes (EPI). The amount of germanium or carbon used in the epitaxial deposition process may be selected so as to adjust the desired level of stress and thickness in the stress-inducing material 22. In one illustrative embodiment, stress-inducing material 22 is a layer of silicon/germanium that is initially formed by performing an EPI deposition process, and it is formed with a compressive or tensile strain so as to induce a compressive or tensile stress on the adjacent fins 14. The manner in which such epi-formed stress-inducing materials 22 are formed so as to impart the desired stress are well known to those skilled in the art. Additionally, if desired, a dopant material, such as an N-type dopant or a P-type dopant material, may be added to the epitaxially formed stress-inducing material 22 during the process of forming the stress-inducing material 22, or the dopant material may be added after the epi stress-inducing material 22 is formed by performing an ion implantation process (not shown).

Figure 1H:
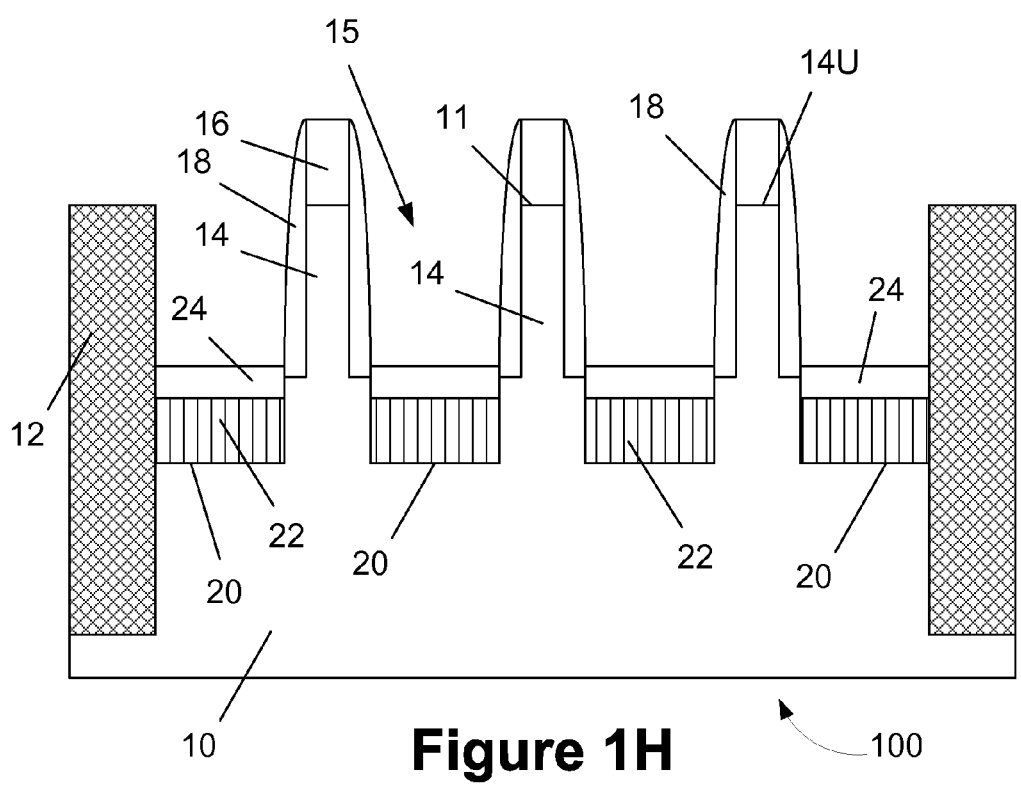

As shown in FIG. 1H, the next process operation involves the formation of schematically depicted isolation regions 24 on the epitaxially formed stress-inducing material 22 in the region between the spacers 18 that are formed on the fins 14. The isolation regions 24 have an upper surface that is below an upper surface 14U of the fins 14. Among other things, the isolation regions 24 may serve to isolate the gate electrode (not shown in FIG. 1H) for the device 100 that is to be subsequently formed. The isolation regions 24 may be comprised of a variety of materials such as, for example, silicon nitride, silicon oxynitride, silicon carbon nitride, or a low-k (k value less that about 3.5) insulating material, etc., they may have a thickness that ranges from about 10-50 nm and they may be formed using a variety of techniques. For example, using one illustrative technique, the isolation regions 24 may be comprised of silicon dioxide and they may be formed by initially depositing a layer of insulating material, such as silicon dioxide, such that it overfills the trenches 15. Thereafter, a chemical mechanical polishing process may be performed on the silicon dioxide material using the hard mask 16 as a polish stop. Thereafter, an etching process may be performed on the layer of silicon dioxide to remove a desired amount of material at the top of the trenches 15, thereby exposing the tops of the fins, as well as portions of the layers 16 and 18.

Figure 1I:
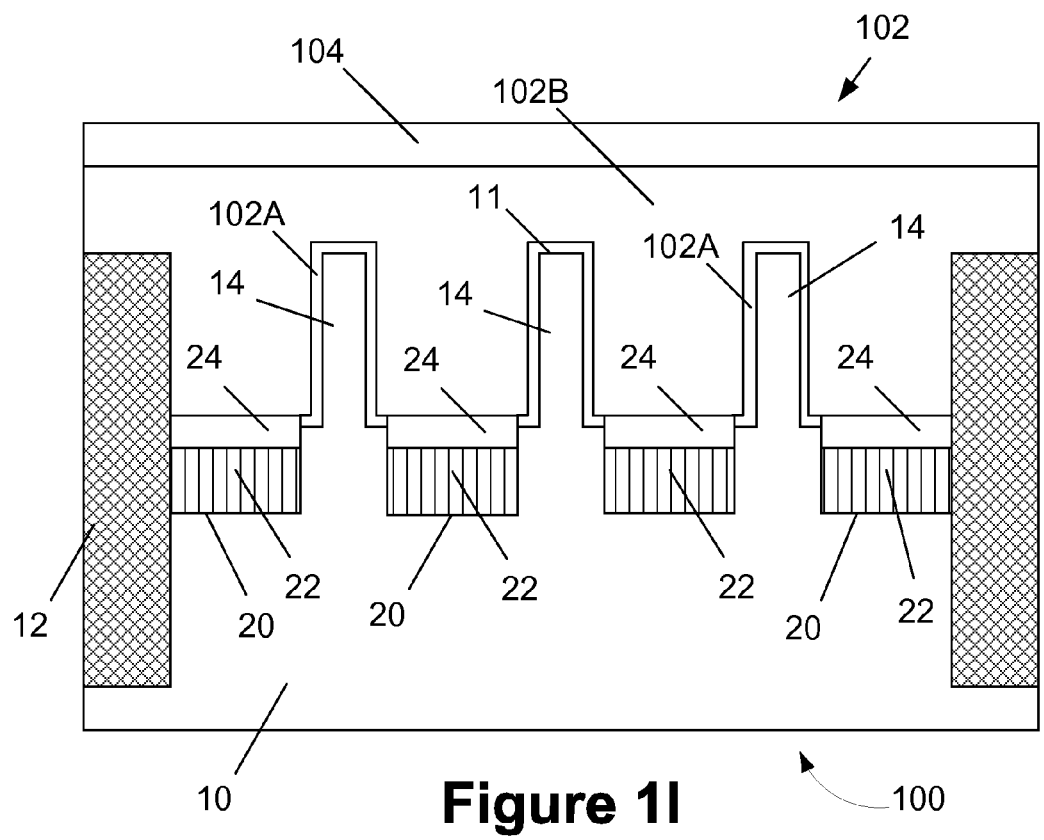

FIG. 1I depicts the device 100 after several process operations have been performed. More specifically, the sidewall spacers 18 have been removed by performing an etching process such as, for example, a wet etching process. In other cases, the spacers 18 may be removed in only selected regions of the fins. Thereafter, a gate electrode structure 102 is formed for the device 100 using well known techniques. In one illustrative embodiment, the schematically depicted gate structure 102 includes an illustrative gate insulation layer 102A and an illustrative gate electrode 102B. A gate cap layer 104 is formed above the illustrative gate electrode layer 102B. The gate insulation layer 102A may be comprised of a variety of different materials, such as, for example, silicon dioxide, a so-called high-k (k greater than 7) insulation material, etc. Similarly, the gate electrode 102B may also be of a material such as polysilicon or amorphous silicon, or it may be comprised of one or more metal layers that act as the gate electrode 102B. As will be recognized by those skilled in the art after a complete reading of the present application, the gate structure 102 of the device 100 depicted in the drawings, i.e., the gate insulation layer 102A and the gate electrode 102B, is intended to be representative in nature. That is, the gate structure 102 may be comprised of a variety of different materials and it may have a variety of configurations, and the gate structure 102 may be made using either so-called "gate-first" or "gate-last" techniques. In one illustrative embodiment, an oxidation process may be performed to form a gate insulation layer 102A comprised of silicon dioxide. Thereafter, the gate electrode material 102B and the cap layer material 104 may be deposited above the device 100 and the layers may be patterned using known photolithographic and etching techniques. The gate cap layer 104 may be made of a variety of materials such as, for example, silicon nitride. Typically, sidewall spacers comprised of, for example, silicon nitride, formed adjacent the gate electrode structure 102 protect and electrically isolate the gate electrode structure, however, such spacers are not shown in FIG. 1I so as not to obscure the present inventions.

Figure 1J:
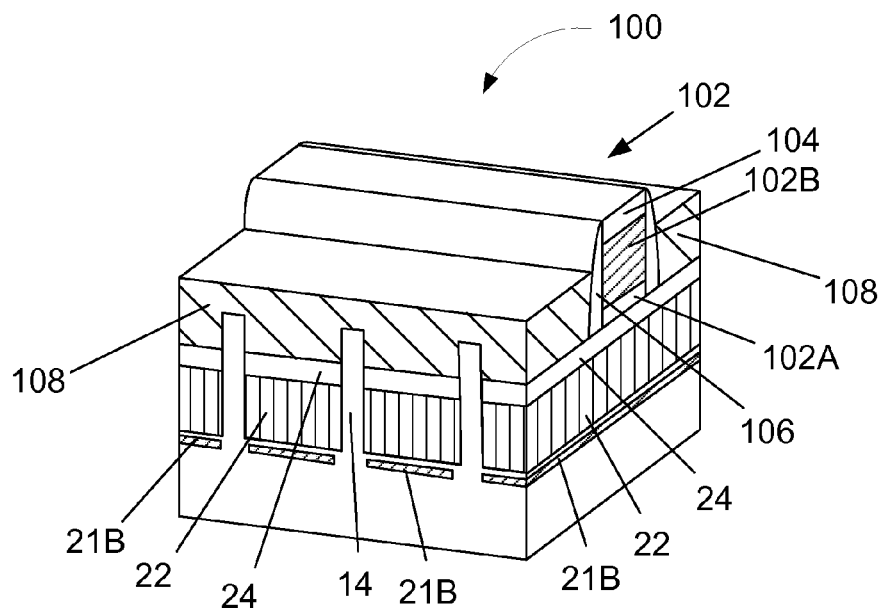

FIG. 1J is a schematic, perspective view of one illustrative embodiment of the FinFET device 100 at a later stage of fabrication. As noted above, the device 100 includes the gate structure 102, the gate cap layer 104, sidewall spacers 106 and the epitaxially formed stress-inducing material 22 described above, with the isolation structures 24 formed there-above. Also depicted in FIG. 1J are the dislocation or defect regions 21B resulting from the implant regions 21A shown in FIG. 1F. FIG. 1J also depicts another epitaxially formed layer of stress-inducing material 108 that is intended to be representative of such material that is typically formed above the source/drain regions (not shown) for such a FinFET device. The purpose of the stress-inducing layer 108 is to impart a desired compressive or tensile stress in the source/drain regions of the device which is structurally (mechanically) transmitted into the fins 14. As noted previously, the manner in which such epitaxially formed stress-inducing materials are formed so as to impart the desired stress are well known to those skilled in the art.

As can be seen in FIG. 1H, positioning the epitaxially formed stress-inducing material 22 in the final trenches 20 facilitates the imposition of the desired stress on the fins 14, i.e., on the channel regions of the device 100, thereby improving the electrical characteristics of the device 100, because the epitaxially formed stress-inducing materials 22 are positioned along substantially the entire length of the fins 14. In some cases, the epitaxially formed stress-inducing material 22 may be comprised of a material that has a larger lattice constant as compared to the silicon substrate, such as silicon/germanium. In such a case, as the relatively larger atoms of the silicon/germanium stress-inducing material 22 align in the silicon lattice structure, the silicon lattice structure is effectively "stretched" beyond its normal interatomic position. By increasing this atomic spacing within the silicon fins, the mobility of electrons is improved which results in more efficient charge conduction in the FinFET transistor. In other cases, the epitaxially formed stress-inducing material 22 may be comprised of a material that has a smaller lattice constant as compared to the silicon substrate, such as silicon/carbon. In such a case, as the relatively smaller atoms of the silicon/carbon stress-inducing material 22 align in the silicon lattice structure, the silicon lattice structure is effectively "shrunk" beyond its normal interatomic position. By decreasing the atomic spacing within the silicon fins, the mobility of holes is improved which results in more efficient charge conduction in the FinFET transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
   forming a plurality of spaced-apart trenches in a semiconducting substrate, said trenches defining at least a portion of a fin for said device;
   performing an epitaxial deposition process to form an epitaxially formed stress-inducing material in said trenches on a first sidewall portion of said fin and on a bottom surface of said trenches;
   forming an insulating material on a top surface of said epitaxially formed stress-inducing material, wherein an uppermost surface of said insulating material is positioned below an upper surface of said fin; and
   forming a gate electrode structure comprising a gate insulation layer positioned on a second sidewall portion of said fin and a gate electrode positioned on said gate insulation material and on and above said insulating material.

2. The method of claim 1, wherein said epitaxially formed stress-inducing material is comprised of a semiconducting material or a rare-earth oxide.

3. The method of claim 1, wherein said epitaxially formed stress-inducing material is an un-doped epitaxially formed stress-inducing material.

4. The method of claim 1, wherein said device is a P-FinFET device and wherein said epitaxially formed stress-inducing material creates compressive strain in a channel region of the P-FinFET device.

5. The method of claim 1, wherein said device is an N-FinFET device and wherein said epitaxially formed stress-inducing material creates tensile strain in a channel region of the N-FinFET device.

6. The method of claim 1, further comprising performing a second epitaxial deposition process to form a layer of epitaxially formed material above said insulating material within said trenches and above the upper surface of said fin in a region not covered by said gate electrode structure.

7. The method of claim 1, wherein, prior to forming said epitaxially formed stress-inducing material, performing a process operation to form implant regions in said substrate below a bottom surface of said trenches.

8. The method of claim 7, wherein said process operation is performed using one of germanium, xenon, tin, krypton or hydrogen.

9. The method of claim 7, wherein said process operation is one of an ion implantation process, a germanium condensation process or a thermal mixing process.

10. A method of forming a device, comprising:
    performing a first etching process to form a plurality of spaced-apart initial trenches in a semiconducting substrate, said initial trenches defining at least a portion of a fin for said device;
    forming sidewall spacers on said fin;
    after forming said sidewall spacers, performing a second etching process to remove material of said semiconducting substrate to extend a depth of said initial trenches into said semiconducting substrate so as to thereby define a plurality of spaced-apart final trenches;
    performing a process operation to form implant regions in said substrate below a bottom surface of said final trenches;
    after performing said process operation, performing an epitaxial deposition process to form an epitaxially formed stress-inducing material in said final trenches on a first sidewall portion of said fin and on a bottom surface of said final trenches;
    forming an insulating material on a top surface of said epitaxially formed stress-inducing material, wherein an uppermost surface of said insulating material is positioned below an upper surface of said fin; and
    forming a gate electrode structure comprising a gate insulation layer positioned on a second sidewall portion of said fin and a gate electrode positioned on said gate insulation material and on and above said insulating material.

11. The method of claim 10, further comprising performing a second epitaxial deposition process to form a layer of epitaxially formed material above said insulating material within said final trenches and above the upper surface of said fin in a region not covered by said gate electrode structure.

12. The method of claim 10, wherein said process operation is performed using one of germanium, xenon, tin, krypton or hydrogen.

13. The method of claim 10, wherein said process operation is one of an ion implantation process, a germanium condensation process or a thermal mixing process.

14. The method of claim 10, further comprising performing an anneal process on said device after said implant regions are formed so as to create defect regions in said substrate proximate a position of said implant regions.

15. The method of claim 14, wherein said anneal process is performed at a temperature of about 650-1100° C.

16. A method of forming a device, comprising:
    performing a first etching process to form a plurality of spaced-apart initial trenches in a semiconducting substrate, said initial trenches defining at least a portion of a fin for said device;
    forming sidewall spacers on said fin;
    after forming said sidewall spacers, performing a second etching process to remove material of said semiconducting substrate to extend a depth of said initial trenches into said semiconducting substrate so as to thereby define a plurality of spaced-apart final trenches;
    performing an ion implantation process to form implant regions in said substrate below a bottom surface of said final trenches;
    after forming said implant regions, performing an anneal process on said device so as to create defect regions in said substrate proximate a position of said implant regions, wherein said anneal process is performed at a temperature of about 650-1100° C.;
    after performing said ion implantation process, performing an epitaxial deposition process to form an epitaxially formed stress-inducing material in said final trenches on a first sidewall portion of said fin and on a bottom surface of said final trenches above said defect regions;
    forming an insulating material on a top surface of said epitaxially formed stress-inducing material, wherein an uppermost surface of said insulating material is positioned below an upper surface of said fin; and
    forming a gate electrode structure comprising a gate insulation layer positioned on a second sidewall portion of said fin and a gate electrode positioned on said gate insulation material and on and above said insulating material.

17. A method of forming a device, comprising:
    forming a plurality of spaced-apart trenches in a semiconducting substrate, said trenches defining at least a portion of a fin for said device;

performing a process operation to form implant regions in said substrate below a bottom surface of said trenches;

performing an anneal process on said device after said implant regions are formed so as to create defect regions in said substrate proximate a position of said implant regions;

after performing said process operation, performing an epitaxial deposition process to form an epitaxially formed stress-inducing material in said trenches on a first sidewall portion of said fin and on a bottom surface of said trenches above said defect regions;

forming an insulating material on a top surface of said epitaxially formed stress-inducing material, wherein an uppermost surface of said insulating material is positioned below an upper surface of said fin; and forming a gate electrode structure comprising a gate insulation layer positioned on a second sidewall portion of said fin and a gate electrode positioned on said gate insulation material and on and above said insulating material.

18. The method of claim 17, wherein said process operation is performed using one of germanium, xenon, tin, krypton or hydrogen.

19. The method of claim 17, wherein said anneal process is performed at a temperature of about 650-1100° C.

20. The method of claim 17, wherein said process operation is one of an ion implantation process, a germanium condensation process or a thermal mixing process.

21. A method of forming a device, comprising:

forming a plurality of spaced-apart trenches in a semiconducting substrate, said trenches defining at least a portion of a fin for said device;

performing an ion implantation process to form implant regions in said substrate below a bottom surface of said trenches; after forming said implant regions, performing an anneal process on said device so as to create defect regions in said substrate proximate a position of said implant regions, wherein said anneal process is performed at a temperature of about 650-1100° C.;

after performing said ion implantation process, performing an epitaxial deposition process to form an epitaxially formed stress-inducing material in said trenches on a first sidewall portion of said fin and on a bottom surface of said trenches above said defect regions;

forming an insulating material on a top surface of said epitaxially formed stress-inducing material, wherein an uppermost surface of said insulating material is positioned below an upper surface of said fin; and forming a gate electrode comprising a gate insulation layer positioned on a second sidewall portion of said fin and a gate electrode positioned on said gate insulation material and on and above said insulating material.

* * * * *